United States Patent
Yang

(10) Patent No.: US 8,832,525 B2
(45) Date of Patent: Sep. 9, 2014

(54) MEMORY CONTROLLER WITH LOW DENSITY PARITY CHECK CODE DECODING CAPABILITY AND RELEVANT MEMORY CONTROLLING METHOD

(71) Applicant: Silicon Motion, Inc., Hsinchu County (TW)

(72) Inventor: Tsung-Chieh Yang, Hsinchu (TW)

(73) Assignee: Silicon Motion, Inc., Zhubei, Hsinchu County (TW)

( * ) Notice: Subject to any disclaimer, the term of this patent is extended or adjusted under 35 U.S.C. 154(b) by 72 days.

(21) Appl. No.: 13/676,822

(22) Filed: Nov. 14, 2012

(65) Prior Publication Data

US 2013/0124940 A1 May 16, 2013

(30) Foreign Application Priority Data

Nov. 15, 2011 (TW) .............................. 100141716 A

(51) Int. Cl.
*H03M 13/00* (2006.01)
*H03M 13/11* (2006.01)
*H03M 13/37* (2006.01)

(52) U.S. Cl.
CPC ...... *H03M 13/1108* (2013.01); *H03M 13/3707* (2013.01); *H03M 13/1111* (2013.01); *H03M 13/3738* (2013.01)

USPC ............................ 714/758; 714/755; 714/773

(58) Field of Classification Search
CPC ........................... H03M 13/2957; H03N 13/29
USPC .................................. 714/755, 758, 773, 763
See application file for complete search history.

(56) References Cited

U.S. PATENT DOCUMENTS

| | | | |
|---|---|---|---|
| 7,818,653 B2 | 10/2010 | Brandman et al. | |
| 8,289,771 B2 * | 10/2012 | Tseng et al. | 365/185.09 |
| 8,508,991 B2 * | 8/2013 | Yang et al. | 365/185.03 |
| 8,578,238 B2 * | 11/2013 | Priewasser et al. | 714/758 |

* cited by examiner

*Primary Examiner* — Fritz Alphonse
(74) *Attorney, Agent, or Firm* — Birch, Stewart, Kolasch & Birch, LLP

(57) ABSTRACT

A memory controller includes a memory access circuit and an LDPC decoding circuit. The memory access circuit reads the hard information of a first code word and a second code word from a memory device. The LDPC decoding circuit decodes the first code word according to the hard information of the first code word. When the LDPC decoding circuit does not decode the first code word successfully, the LDPC decoding circuit configures the memory access circuit to read the soft information of the first code word and the second code word, and decodes the first code word and the second code word according to the soft information of the first code word and the second code word.

20 Claims, 9 Drawing Sheets

MEMORY CONTROLLER WITH LOW DENSITY PARITY CHECK CODE DECODING CAPABILITY AND RELEVANT MEMORY CONTROLLING METHOD

CROSS-REFERENCE TO RELATED APPLICATIONS

This application claims the benefit of priority to Patent Application No. 100141716, filed in Taiwan on Nov. 15, 2011; the entirety of which is incorporated herein by reference for all purposes.

BACKGROUND

The disclosure generally relates to a memory controller and, more particularly, to the memory controller with the low density parity check code decoding capability.

In the applications involving signal communications, the error correcting code is often utilized in the receiver to correct the error in the received signal. For example, the memory controller may encode the data according to a predetermined error correcting code and write the encoded data to the memory device. When errors occur in the process of reading the encoded data, the error correcting code decoder of the memory controller may correct the error to obtain the correct data.

Although the error correcting codes may be utilized in many applications, there are still some differences when utilizing the error correcting codes in different systems. For example, in communication systems, when the condition of the communication channel is too worse for the error correcting code decoder to successfully decode, the receiver may request the transmitter to resend the same data. The transmitter may encode the data with a stronger error correcting code, re-transmit the same data in another time, and/or re-transmit the same data in another frequency so that the receiver may recover the data because of the stronger error correcting code and/or a better channel condition.

On the other hand, in the storage applications, the data are not only affected by the channel effects and the noise in the signal transmission process, but also affected by the data rot and the noise in the memory device. If the data stored in the memory device is already damaged, it is not possible to re-encode the encode data stored in the memory device with a stronger error correcting code. Besides, transmitting the damaged data in another time, another frequency, or a better channel still does not improve the condition. The approaches utilized in the communication system are apparently not applicable in the storage applications.

Moreover, for the mass produced memory devices, the quality control may often be accomplished by picking a certain samples in a huge amount of products and verifying their performance. Along with the advance in the semiconductor manufacturing technology, the dimension of the memory device keeps shrinking but the capacity of the memory device keeps increasing. Therefore, more and more errors occur when accessing the data stored in the memory devices. The error correcting code decoding capability is an essential factor for determining the quality of the memory devices. The memory controller with a stronger error correcting code decoding capability requires higher computational complexity, longer computation time, and more energy, which limits the application of the memory device. For example, the portable devices usually adopt the low power consumption memory device to extend the battery usage time. On the other hand, the memory controller usually adopts the direct memory access technique, the double pumping technique, etc. to reduce the memory access time. Therefore, the memory access time is usually far less than the error correcting code decoding time. If the error correcting code decoding time may not be reduced, the output data rate and the performance of the memory device will be severely influenced.

SUMMARY

In view of the foregoing, it can be appreciated that a substantial need exists for methods and apparatuses that can mitigate or reduce the problems above.

An example embodiment of a memory controller, comprising: a memory access circuit for reading a hard information of a first code word and a hard information of a second code word; and a low density parity check (LDPC) decoding circuit for decoding the first code word according to the hard information of the first code word, and for comparing a check value generated according to the hard information of the first code word with a decoding indicator; wherein the LDPC decoding circuit determines whether decoding the first code word according the hard information of the first code word is successful according to the check value and the decoding indicator; and when decoding the first code word according the hard information of the first code word is not successful, the LDPC decoding circuit configures the memory access circuit to read a soft information of the first code word and decodes the first code word according to the soft information of the first code word.

Another example embodiment of a memory controller, comprising: a memory access circuit for reading a first code word and a second code word from one or more memory devices, wherein the first code word and the second code word respectively comprises a plurality of coded bits; and a low density parity check (LDPC) decoding circuit for decoding the first code word according to the hard information of the coded bits of the first code word; wherein when the LDPC decoding circuit does not decode the first code word successfully according to the hard information of the coded bits of the first code word, the LDPC decoding circuit configures the memory access circuit to read the soft information of the coded bits of the first code word and the soft information of the coded bits of the second code word, and decodes the first code word and the second code word according to the soft information of the coded bits of the first code word and the soft in-formation of the coded bits of the second code word.

Another example embodiment of a memory control method, comprising: reading a hard information of a first code word and a hard information of a second code word; decoding the first code word according to the hard information of the first code word; generating a check value according to the hard information of the first code word; comparing the check value with a decoding indicator; verifying whether decoding the first code word according the hard information of the first code word is successful according to the check value and the decoding indicator; and reading a soft information of the first code word and decoding the first code word according to the soft information of the first code word when decoding the first code word according the hard information of the first code word is not successful.

Another example embodiment of a memory control method, comprising: reading a first code word and a second code word from one or more memory de-vices, wherein the first code word and the second code word respectively comprises a plurality of coded bits; performing a low density parity check (LDPC) decoding according to the hard in-formation of the coded bits of the first code word; when the first code word is not decoded successfully, reading the soft information of the coded bits of the first code word and the soft information of the coded bits of the second code word, and decoding the first code word and the second code word according to the soft information of the coded bits of the first code word and the soft information of the coded bits of the second code word.

It is to be understood that both the foregoing general description and the following detailed description are example and explanatory only and are not restrictive of the invention, as claimed.

All of the drawings are arranged in accordance with at least some embodiments described herein.

DETAILED DESCRIPTION

Reference is made in detail to embodiments of the invention, which are illustrated in the accompanying drawings.

Figure 1:
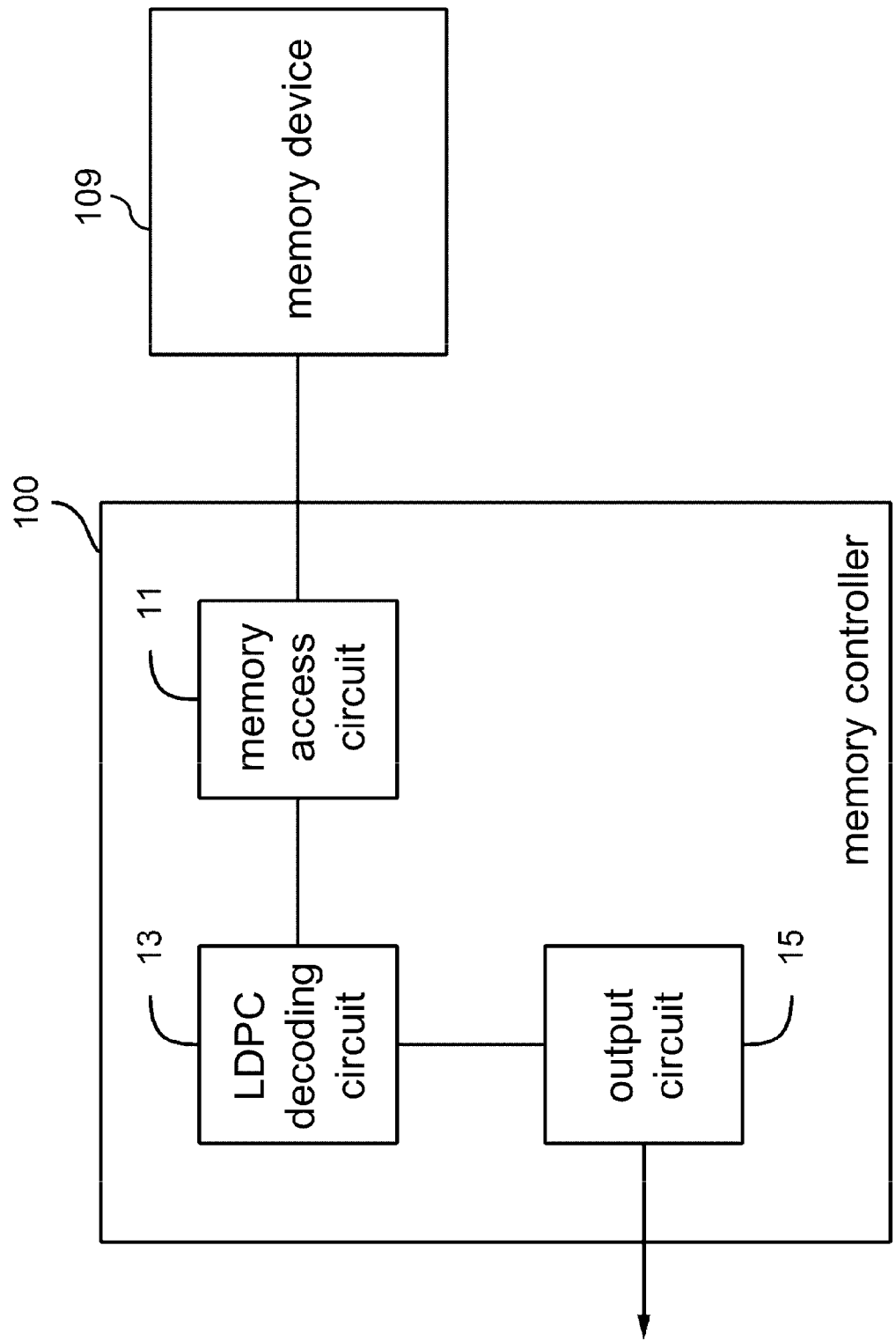
FIG. 1 shows a simplified functional block diagram of an example memory controller.

FIG. 1 shows a simplified functional block diagram of an example memory controller 100. The memory controller 100 comprises a memory access circuit 11, an LDPC (low density parity check) decoding circuit 13, and an output circuit 15. The memory device 109 in FIG. 1 may be realized with one or more flash memory devices. In other embodiments, the memory device 109 may also be realized with one or more suitable volatile and/or non-volatile memory devices.

The memory access circuit 11 of the memory controller 100 reads encoded data from the memory device 109. In the embodiment in FIG. 1, only a memory access circuit 11 and a memory device 109 are shown for the purposes of conciseness and easier explanation. In other embodiments, the memory controller 100 may comprises one or more memory access circuits for accessing the data in one or more memory devices. An encoding device (not shown in FIG. 1) inside or outside the memory controller 100 may generate the encoded data by performing the LDPC encoding operations, and the memory access circuit 11 or other memory access circuit (not shown in FIG. 1) may write the encoded data to the memory device 109. Moreover, the LDPC encoding parameter(s), e.g., the block size, the parity check matrix, and the generator matrix, may be configured according to the architecture of the memory controller 100, the architecture of the memory device 109, or other design considerations.

The LDPC decoding circuit 13 configures the memory access circuit 11 to read the encode data from the memory device 109 and transmit the encoded data to the LDPC decoding circuit 13. After receiving the encoded data transmitted by the memory access circuit 11, the LDPC decoding circuit 13 performs LDPC decoding operations on the received data.

The output circuit 15 may transmit the decoded output of the LDPC decoding circuit 13 to another device (not shown in FIG. 1), e.g., a computer and a portable device.

Figure 2:
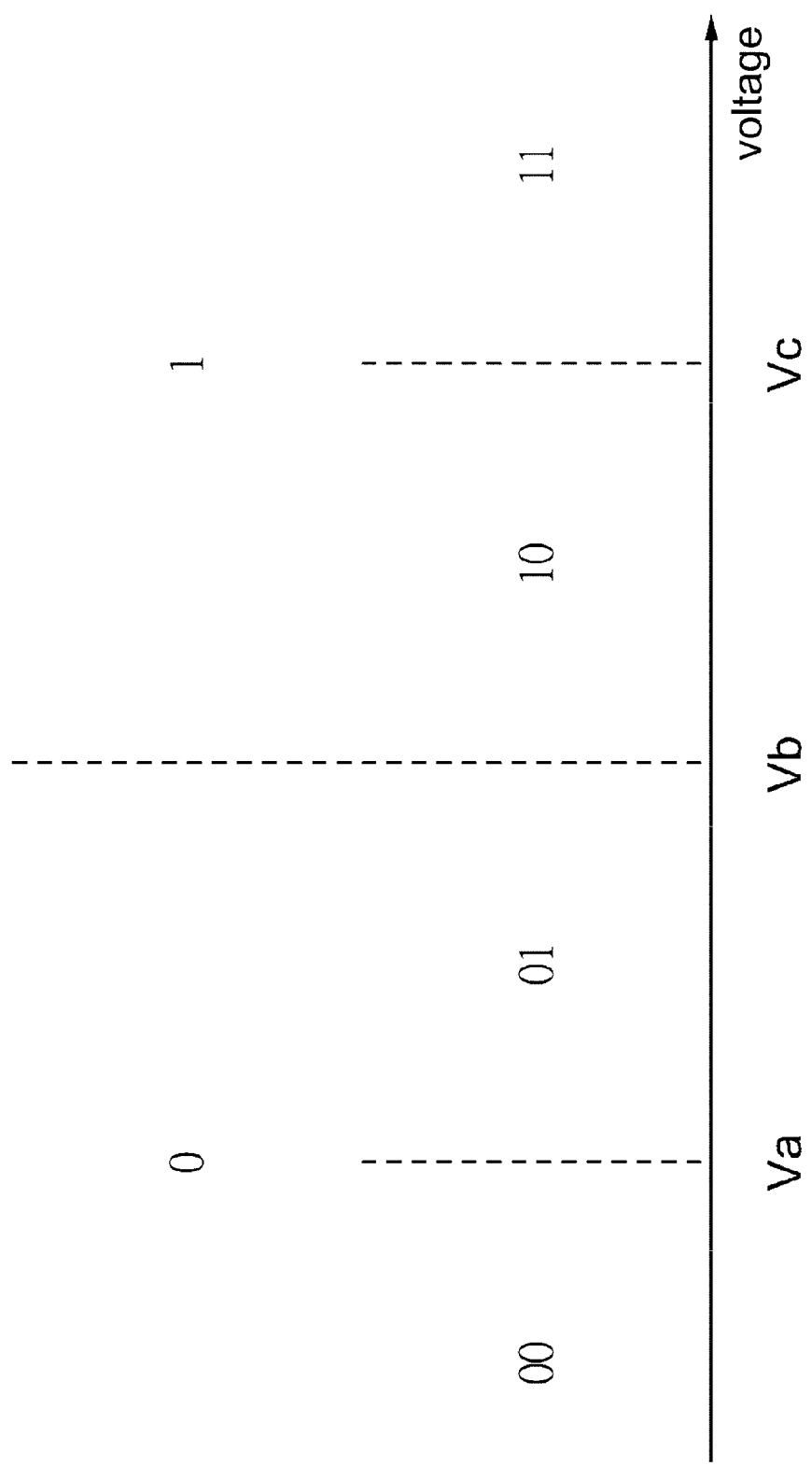
FIG. 2 shows a simplified state diagram of an example memory cell in the memory device in FIG. 1.

FIG. 2 shows a simplified state diagram of an example memory cell in the memory device 109 in FIG. 1. In this embodiment, the memory device 109 comprises a plurality of memory cells, and a memory cell is used to store one bit of data. According to the voltage status stored in the memory cell, the memory access circuit 11 may read the hard information of the 1-bit data and/or the soft information of the 1-bit data to be the content of the memory cell.

In one embodiment, a 1-bit hard information is used to represent the 1-bit data stored in a memory cell. When the voltage status stored in the memory cell is greater than Vb, the memory access circuit 11 reads a 1-bit value, 1. When the voltage status stored in the memory cell is less than Vb, the memory access circuit 11 reads a 1-bit value, 0. Moreover, a 2-bit soft information is used to represent the 1-bit data stored in a memory cell. When the voltage status stored in the memory cell is greater than Vc, the memory access circuit 11 reads a 2-bit value, 11. When the voltage status stored in the memory cell locates between Vb and Vc, the memory access circuit 11 reads a 2-bit value, 10. When the voltage status stored in the memory cell locates between Va and Vb, the memory access circuit 11 reads a 2-bit value, 01. When the voltage status stored in the memory cell is less than Va, the memory access circuit 11 reads a 2-bit value, 00.

In this embodiment, the memory access circuit 11 may configure the memory device 109 to generate the hard information and the soft information of the data in the memory cell by an internal circuit of the memory device 109 and one or more suitable threshold voltages.

In another embodiment, the memory access circuit 11 may read the voltage status of the memory cells of the memory device 109 and compare with one or more suitable threshold voltages to generate the hard information and/or the soft information of the stored data.

In other embodiments, the memory cell may be used to store a data with a plurality of bits. For example, a multi-level cell and a triple-level cell may be respectively used to store two bits of data and three bits of data. Thus, the bit number of the hard information of the multi-level cell may be configured to be two and the bit number of the soft information of the multi-level cell may be configured to be three or more. The bit number of the hard information of the triple-level cell may be configured to be three and the bit number of the soft information of the triple-level cell may be configured to be s four or more.

In another embodiment, the memory access circuit 11 reads the stored data of the memory cell by retrieving the voltage value, the current value, the electric charge value, or other signal value of the memory cell. The memory access circuit 11 converts the retrieved signal value to the hard information and/or the soft information.

The soft information of the data stored in the memory cell may comprise or does not comprise the hard information of the data. For example, in one embodiment, the soft information of the stored data may be configured to comprise the hard information of the stored data and one or more additional bits. In another embodiment, the soft information of the stored data does not comprise the hard information of the stored data. For example, in one embodiment, the hard information and the soft information of the stored data may be encoded according to different encoding rules so that the soft information of the stored data does not comprise the one or more bits of the hard information of the stored data.

In another embodiment, the hard information and the soft information may be encoded according to any suitable encoding rule. For example, in the embodiment in FIG. 2, the soft information of the data stored in the memory cell may be configured to be any suitable combination of the four 2-bit values (i.e., 00, 01, 10 and 11) by comparing the voltage status of the memory cell with suitable threshold voltages.

In another embodiment, the hard information and the soft information of the stored data may be configured to have the same number of bits. The useful number of bits (or combinations) of the soft information is, however, more than the useful number of bits (or combinations) of the hard information. For example, in the embodiment in FIG. 2, the memory cell may generate two possible values of the hard information (i.e., 00 or 11) and four possible values of the soft information (i.e., 00, 01, 10 and 11). Although the number of bits of the hard information and the soft information are the same (i.e., two bits in this embodiment), the hard information only have two possible values and the soft information has four possible values.

The LDPC decoding circuit 13 in FIG. 1 may be realized with any suitable type of decoding device for performing the LDPC decoding algorithm. For example, the LDPC decoding circuit 13 may perform the LDPC decoding operations by the belief propagation approach, the maximum likelihood decoding approach, the sum-product algorithm, the minimum-sum algorithm, the parallel decoding algorithm, the iterative decoding algorithm, etc. Moreover, the LDPC decoding circuit 13 may be realized with hardware, software, firmware, and the combination therefore.

Figure 3:
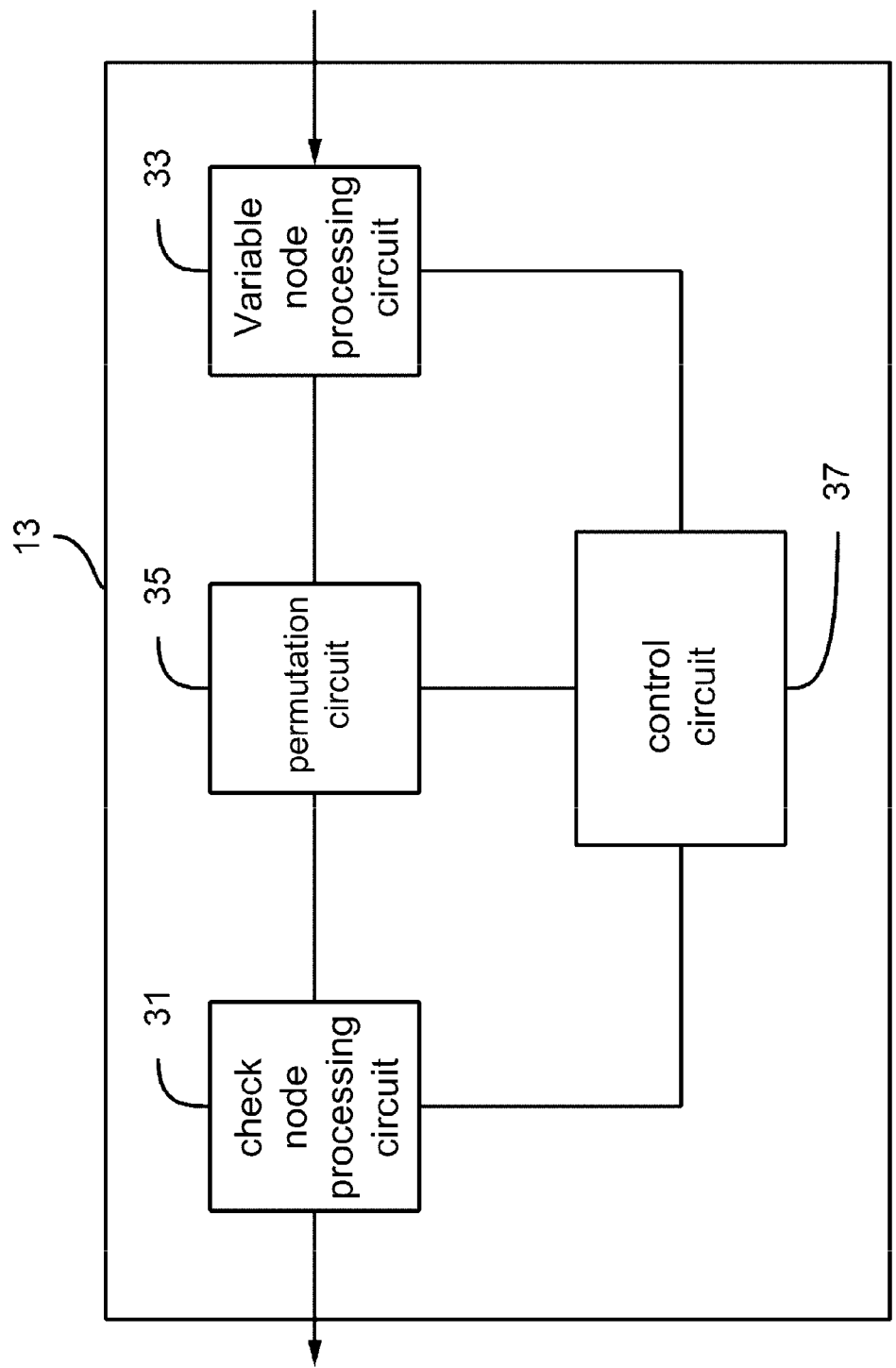
FIG. 3 shows a simplified functional block diagram of an example LDPC decoding circuit in FIG. 1.

FIG. 3 shows a simplified functional block diagram of an example LDPC decoding circuit 13 in FIG. 1. The operations of the LDPC decoding circuit 13 are further explained below with reference to FIG. 3. The LDPC decoding circuit 13 comprises a check node processing circuit 31, a variable node processing circuit 33, a permutation circuit 35, and a control circuit 37. The embodiments of the check node processing circuit 31, the variable node processing circuit 33, the permutation circuit 35 for realizing the above algorithms is well known in this field. The person skilled in the art may realize these circuits with the suitable structure according to different design considerations.

The check node processing circuit 31 is used to calculate the check node messages of the check nodes. The variable node processing circuit 33 is used to calculate the variable node messages of the variable nodes (a.k.a., bit nodes). The permutation circuit 35 is used to couple the check node processing circuit 31 with the variable node processing circuit 33 so that the check node messages and the variable messages may be respectively transmitted to the designated variable nodes and the designated check nodes. Thus, the check node processing circuit 31 and the variable node processing circuit 33 may iteratively perform LDPC decoding operations according to the check node messages and the variable node messages.

The check node message may carry the possible value at the check node, the possibility of the value at the check node being 0 or 1, the likelihood of the value at the check node being 0 or 1, the posteriori probability of the value at the check node being 0 or 1, etc. Similarly, the variable node message may carry the possible value at the variable node, the possibility of the value at the variable node being 0 or 1, the likelihood of the value at the variable node being 0 or 1, the posteriori probability of the value at the variable node being 0 or 1, etc. The check node messages and the variable node messages may be respectively represented in the log domain, in the linear domain, and/or in other suitable style.

The control circuit 37 is used to configure the check node processing circuit 31, the variable node processing circuit 33, and the permutation circuit 35. Thus, the variable node processing circuit 33 may calculate the variable node messages according to the hard information and/or the soft information of the encoded data. The variable node message may be transmitted to the check node processing circuit 31 by the permutation circuit 35 so as to calculate the check node messages. The check node messages may be transmitted to the variable node processing circuit 33 by the permutation circuit 35 so as to iteratively perform the LDPC decoding operations. The control circuit 37 may determine whether the encoded data are successfully decoded according to the check node messages and/or the variable node messages.

For example, the control 37 may generate an estimation value of the decoded data according to the check node messages. A check value may be generated according to the inner product (or other suitable computation result) of the estimation value of the decoded data and a parity check matrix. The control 37 may determine whether the LDPC decoding operations are successful when the check value equals 0.

Moreover, the LDPC decoding circuit 13 may be configured to perform predetermined iterations of decoding operations and the control circuit 37 determines whether the decoding operations are successful according to the check node messages and/or the variable node messages. For example, in one embodiment, the LDPC decoding circuit 13 may be configured to perform at most 20 iterations of decoding operations. The control circuit 37 determines the decoding operations are not successful if the check value is not equal to 0 after the 20 iterations of decoding operations. In this embodiment, it does not, however, mean that the LDPC decoding circuit 13 definitely cannot successfully decode the encoded data when the control circuit 37 determines the decoding operations are not successful. It only means that the LDPC decoding circuit 13 may not successfully decode the encoded data in the predetermined iterations of LDPC decoding operations.

The LDPC decoding circuit 13 may perform the decoding operations according to the hard information of the encoded data and the soft information of the encoded data received from the memory access circuit 11 (respectively referred to as "hard decoding operation" and "soft decoding operation" herein for conciseness).

Most of the encoded data may be successfully decoded with the hard decoding operations. Besides, the computation time and the consumed energy of the hard decoding operations are usually less than those of the soft decoding operations. The soft decoding operation, however, has better error correction capability.

In one embodiment, the LDPC decoding circuit 13 may be configured to perform the hard decoding operations on the encoded data first to reduce the decoding time and the consumed energy. When the hard decoding operations do not decode successfully, the LDPC decoding circuit 13 performs the soft decoding operations on the encoded data. Therefore, the LDPC decoding circuit 13 may possess a satisfactory decoding speed and reduce the consumed energy while still maintaining the required error correction capability.

As mentioned above, the decoding operations usually consume a lot of time and energy. If the LDPC decoding circuit may predict that the decoding operations of the encoded data are not likely to be successful at an early stage and perform corresponding measures, the decoding time and the consumed energy may be further reduced. Therefore, in other embodiments, the LDPC decoding circuit 13 may utilize one or more decoding indicators for predicting whether the decoding operations will be successful.

For example, the control circuit 37 may generate the check value according to the check node messages, the variable node messages, and/or the computation value thereof, and compare the check value with the decoding indicator. According to the definition of the check value, the control circuit 37 may predict that the LDPC decoding circuit 13 will not decode successfully when the check value is greater than the decoding indicator. In other embodiments, the control circuit 37 may also predict that the LDPC decoding circuit 13 will not decode successfully when the check value is less than the decoding indicator.

The control circuit 37 may compare the check value with the decoding indicator after one or more iterations of decoding operations to determine whether the LDPC decoding circuit 13 will decode successfully. For example, the control circuit 37 may compare the check value with the decoding indicator after the $10^{th}$ iteration of decoding operation, after the $5^{th}$ and the $10^{th}$ iterations of decoding operations, after every iteration of decoding operations, etc. to determine whether the LDPC decoding circuit 13 will decode successfully.

In one embodiment, the LDPC decoding circuit 13 performs the hard decoding operations first. When the hard decoding operations are not successful, the LDPC decoding circuit 13 performs the soft decoding operations. Moreover, the LDPC decoding 13 may utilize one or more decoding indicators to further reduce the computation time and the consumed energy. For example, the LDPC decoding circuit 13 is configured to perform at most 20 iterations of the hard decoding operations, and the control circuit 37 compares the check value with the decoding indicator after the $5^{th}$ iteration of the hard decoding operations to determine whether the LDPC decoding circuit 13 will decode successfully. When the control circuit 37 determines the LDPC decoding circuit 13 will not decode successfully, it means the LDPC decoding circuit 13 probably will not successfully decode the encoded data within the predetermined iterations (e.g., 20 iterations in this embodiment) of the hard decoding operations. Therefore, the control circuit 37 may stop the hard decoding operations after the $5^{th}$ iteration and instead perform the soft decoding operations on the encoded data. Otherwise, the control circuit 37 configures the check node processing circuit 31, the variable node processing circuit 33, and the permutation circuit 35 to continue the hard decoding operations till the encoded data are successfully decoded, till the end of performing the predetermined iterations, or till the control circuit 37 determines to stop the hard decoding operations.

Figure 4:
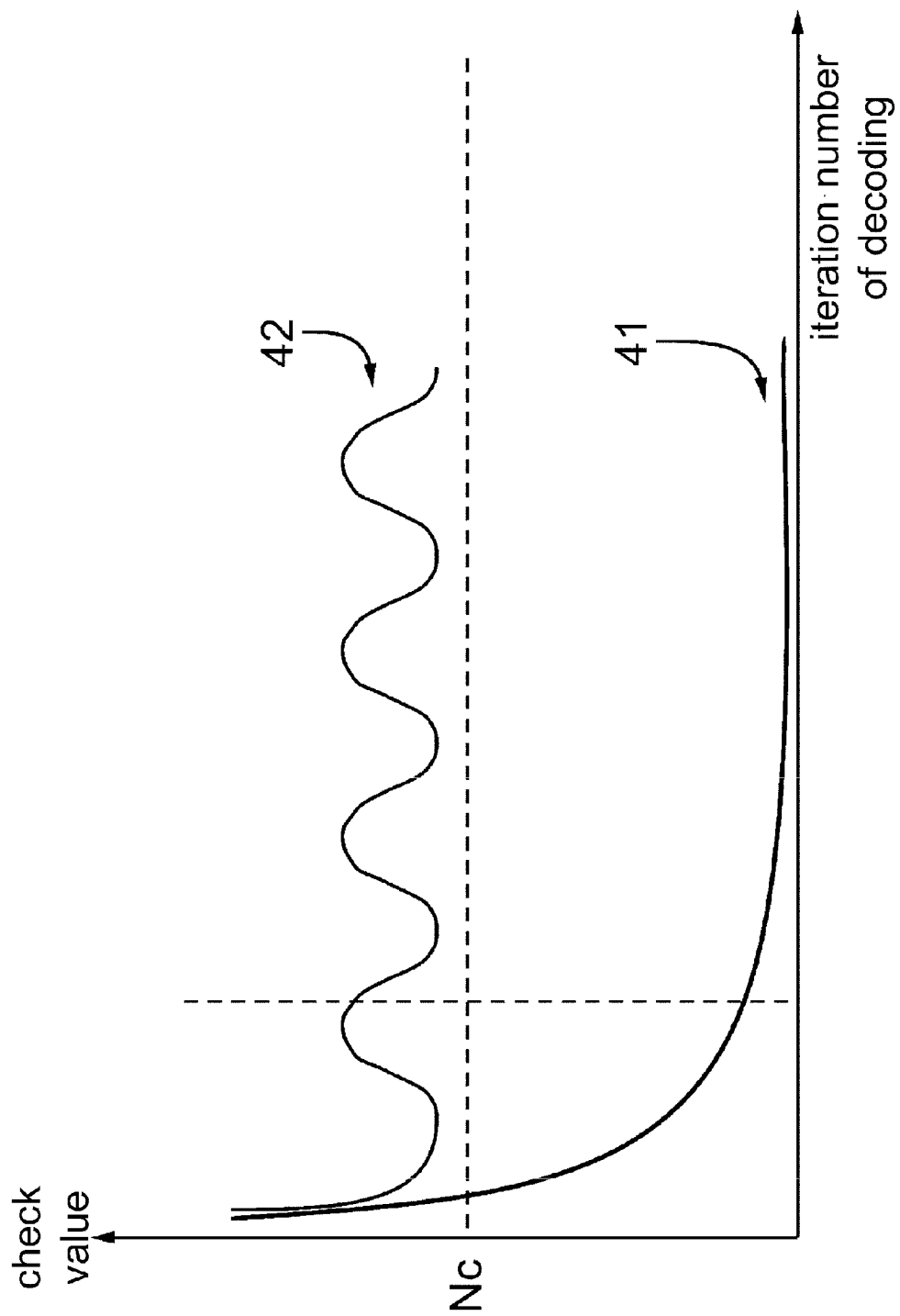
FIG. 4 shows a simplified schematic diagram of example check values generated when the LDPC decoding circuit performs decoding operations.

In the embodiment in FIG. 4, the control circuit 37 generates the check values according to the inner product of the check node messages and the parity check matrix, and compares the check value with the decoding indicator. For example, the check equation number calculated according to the check node messages may be utilized as the check value.

The curves 41 and 42 in FIG. 4 respectively represent the check values after each iteration of the hard decoding operations when the LDPC decoding circuit 13 performs LDPC decoding operations. The curve 41 represents the case that the LDPC decoding circuit 13 successfully decodes, and the curve 42 represents the case that the LDPC decoding circuit 13 does not successfully decode. In FIG. 4, when the hard decoding operations are successful, the check values in the curve 41 become less than a value Nc after a certain iterations of hard decoding operations. When the hard decoding operations are not successful, the check values in the curve 42 still maintains greater than the value Nc after several iterations of hard decoding operations.

Therefore, if the check value is still greater than the value Nc after the LDPC decoding circuit performs a certain iterations of hard decoding operations, it is very possible that the LDPC decoding circuit 13 will not successfully decode or will not successfully decode within the predetermined iterations. In this embodiment, the decoding indicator may be configured to be the value Nc. The control circuit 37 may compare the check value with the decoding indicator Nc to predict whether the LDPC decoding circuit 13 will decode successfully and whether the hard decoding operations should be stopped. In the above embodiment, when the control circuit 37 finds out the check value is greater than the decoding indicator Nc after 5 iterations of hard decoding operation, the control circuit 37 determines the LDPC decoding circuit will not decode successfully, stops the following hard decoding operations, and continues decoding the encoded data with the soft decoding operations.

Figure 5:
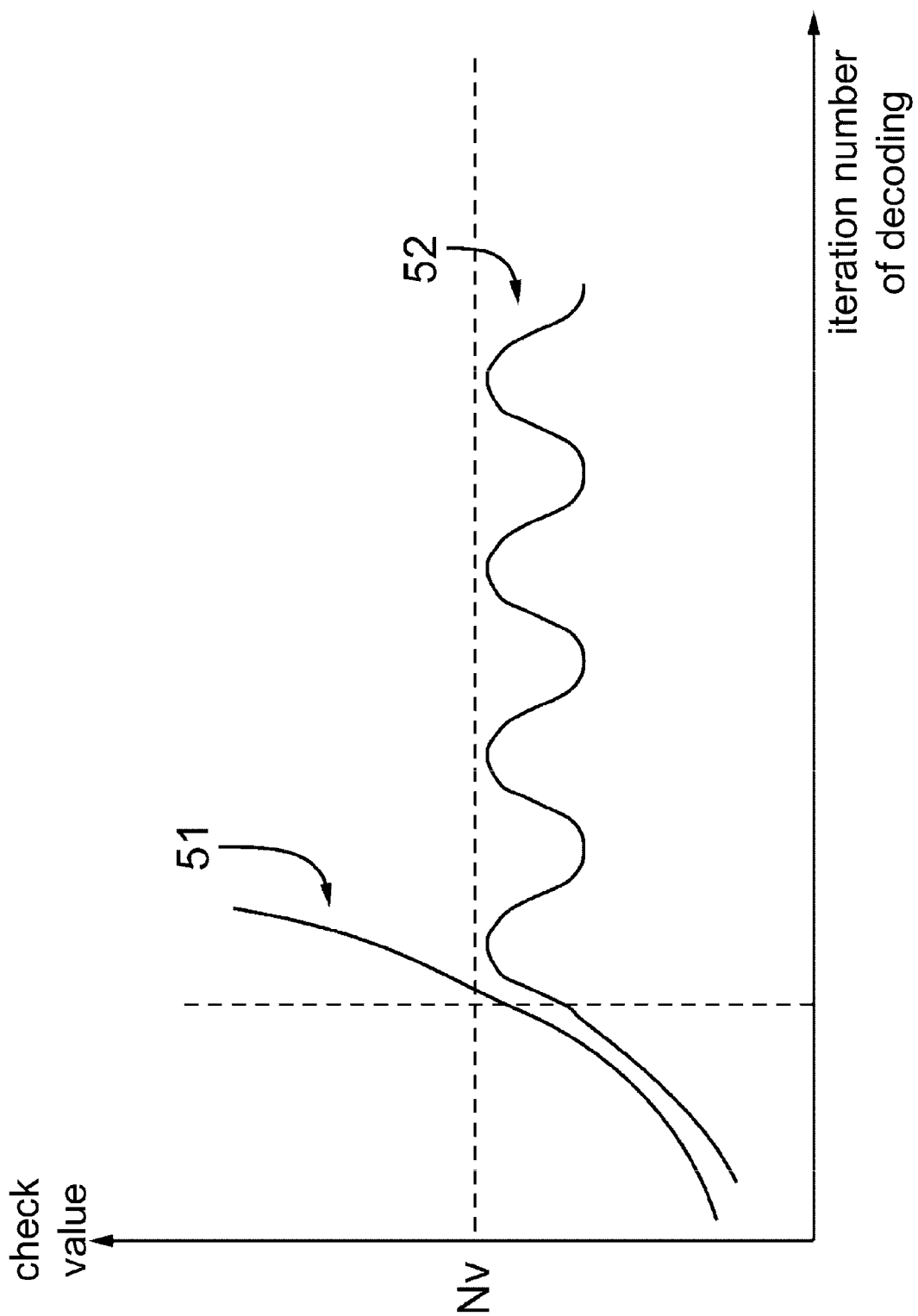
FIG. 5 shows another simplified schematic diagram of example check values generated when the LDPC decoding circuit performs decoding operations.

In the embodiment in FIG. 5, the control circuit 37 generates the check value according to the variable node messages, and compares with the decoding indicator. For example, the check value may be configured according to the sum of all variable node messages, the sum of a part of variable node messages, the sum of a predetermined number of greatest variable node messages, the sum of a predetermined number of smallest variable node messages, the sum of all order set values, and/or the sum of a part of order set values.

The curves 51 and 52 in FIG. 5 respectively represent the check values after each iteration of the hard decoding operations when the LDPC decoding circuit 13 performs LDPC decoding operations. The curve 51 represents the case that the LDPC decoding circuit 13 successfully decodes, and the curve 52 represents the case that the LDPC decoding circuit 13 does not successfully decode. In FIG. 5, when the decoding operations are successful, the check values in the curve 51 become greater than a value Nv after a certain iterations of hard decoding operations. When the decoding operations are not successful, the check values in the curve 52 still maintains less than the value Nv after several iterations of hard decoding operations.

Therefore, if the check value is still greater than the value Nv after the LDPC decoding circuit performs a certain iterations of hard decoding operations, it is very possible that the LDPC decoding circuit 13 will not successfully decode or will not successfully decode within the predetermined iterations. In this embodiment, the decoding indicator may be configured as the value Nv. The control circuit 37 may compare the check value with the decoding indicator Nv to predict whether the LDPC decoding circuit 13 will decode successfully and whether the hard decoding operations should be stopped. In the above embodiment, when the control circuit 37 finds out the check value is less than the decoding indicator Nv after 5 iterations of hard decoding operations, the control circuit 37 determines the LDPC decoding circuit will not decode successfully, stops the following hard decoding operations, and continues decoding the encoded data with the soft decoding operations.

In the embodiments above, the decoding indicator may be configured to be the check value in a previous time. When the difference between the check value and the decoding indicator is less than a predetermined value (or greater than a predetermined value according to the definition of the check value), the control circuit 37 determines the LDPC will not successfully decode.

In the embodiments above, the control circuit 37 may compare multiple check values respectively with one or more decoding indicators so as to predict whether the LDPC decoding circuit 13 will successfully decode.

Figure 6:
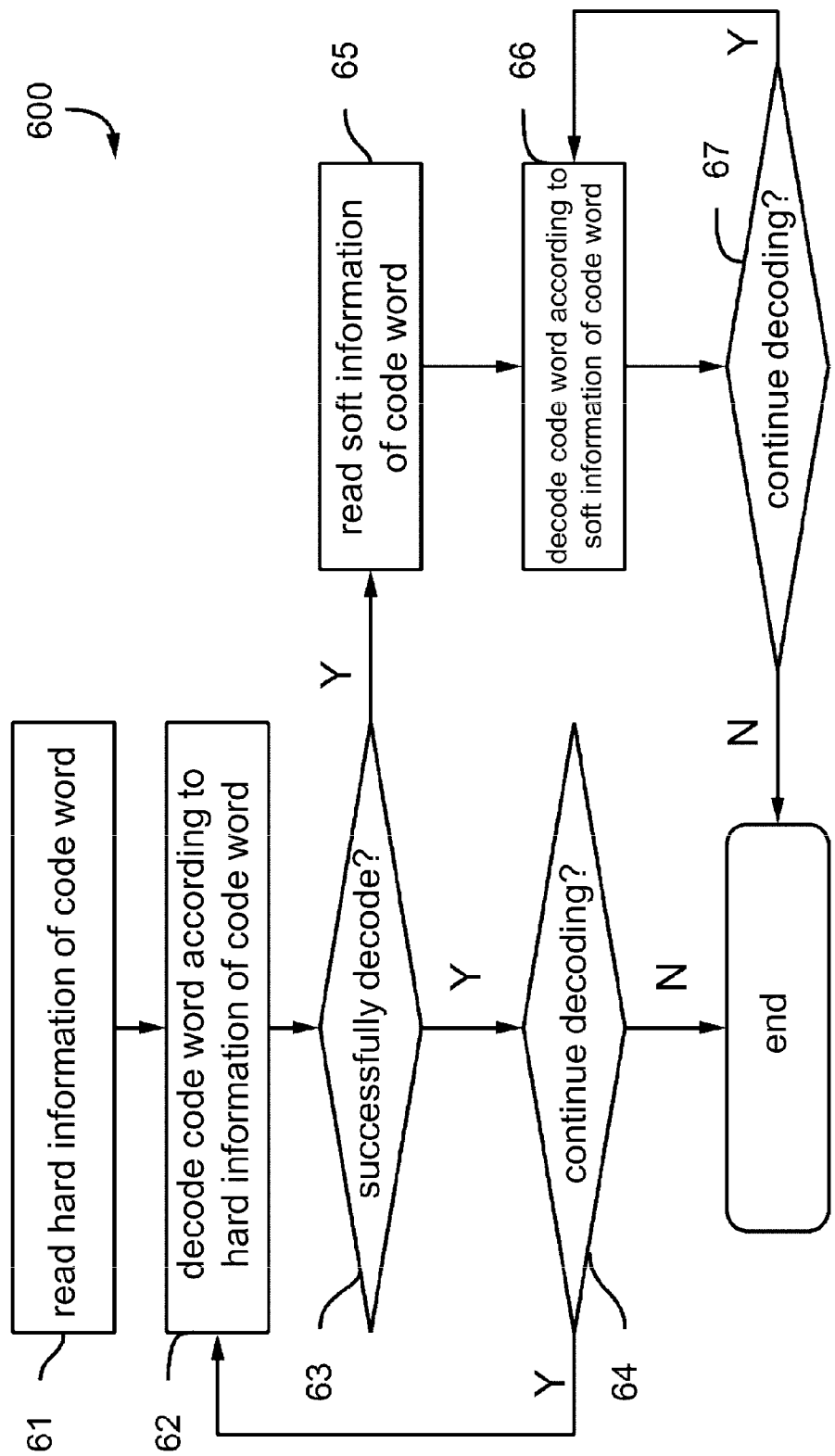
FIG. 6 shows a simplified flowchart of an example operating method of the memory controller in FIG. 1.

FIG. 6 shows a simplified flowchart 600 of an example operating method of the memory controller 100. The memory controller 100 is further explained below with reference to FIGS. 1, 3 and 6.

In the operation 61, the LDPC decoding circuit 13 configures the memory access circuit 11 to read the hard information of a plurality of code words from the memory device 109. Each code word may comprise a plurality of LDPC encoded bits. The hard information of each encoded bit may comprise one or more bits.

In the operation 62, the LDPC decoding circuit 13 performs the decoding operations according to the hard information of the code words.

In the operation 63, when the LDPC decoding circuit 13 determines the decoding operations are successful, the method proceeds to the operation 64. Otherwise, the method proceeds to the operation 65.

In the operation 64, when there are still code words to be decoded, the method move back to the operation 62 and the LDPC decoding circuit 13 continues the hard decoding operations on the next code word. If not, the decoding operations are finished.

In the operation 65, the LDPC decoding circuit 13 configures the memory access circuit 11 to read the soft information of the code words, which are not successfully decoded with the hard decoding operations.

In the operation 66, the LDPC decoding circuit 13 perform the decoding operations according to the soft information of the code words or according to both the hard information and the soft information of the code words (depends on the definition of the hard information and the soft information).

In the operation 67, when there are still code words to be decoded, the method move back to the operation 66 and the LDPC decoding circuit 13 continues the soft decoding operations on the next code word. If not, the decoding operations are finished.

In the operation 67 in another embodiment, when there are still code words to be decoded, the method move back to the operation 62 and the LDPC decoding circuit 13 continues the hard decoding operations on the next code word. If not, the decoding operations are finished.

In another embodiment, when the LDPC decoding circuit 13 does not successfully decode in the operation 66, the LDPC decoding circuit 13 may generate one or more messages indicating the code word cannot be decoded successfully.

In the above embodiment, the memory access circuit 11 and the LDPC decoding circuit 13 may operate independently to enhance the processing speed. For example, when the LDPC decoding circuit 13 performs the decoding operations on a code word, the memory access circuit 11 may read another code word from the memory device 109.

Figure 7:
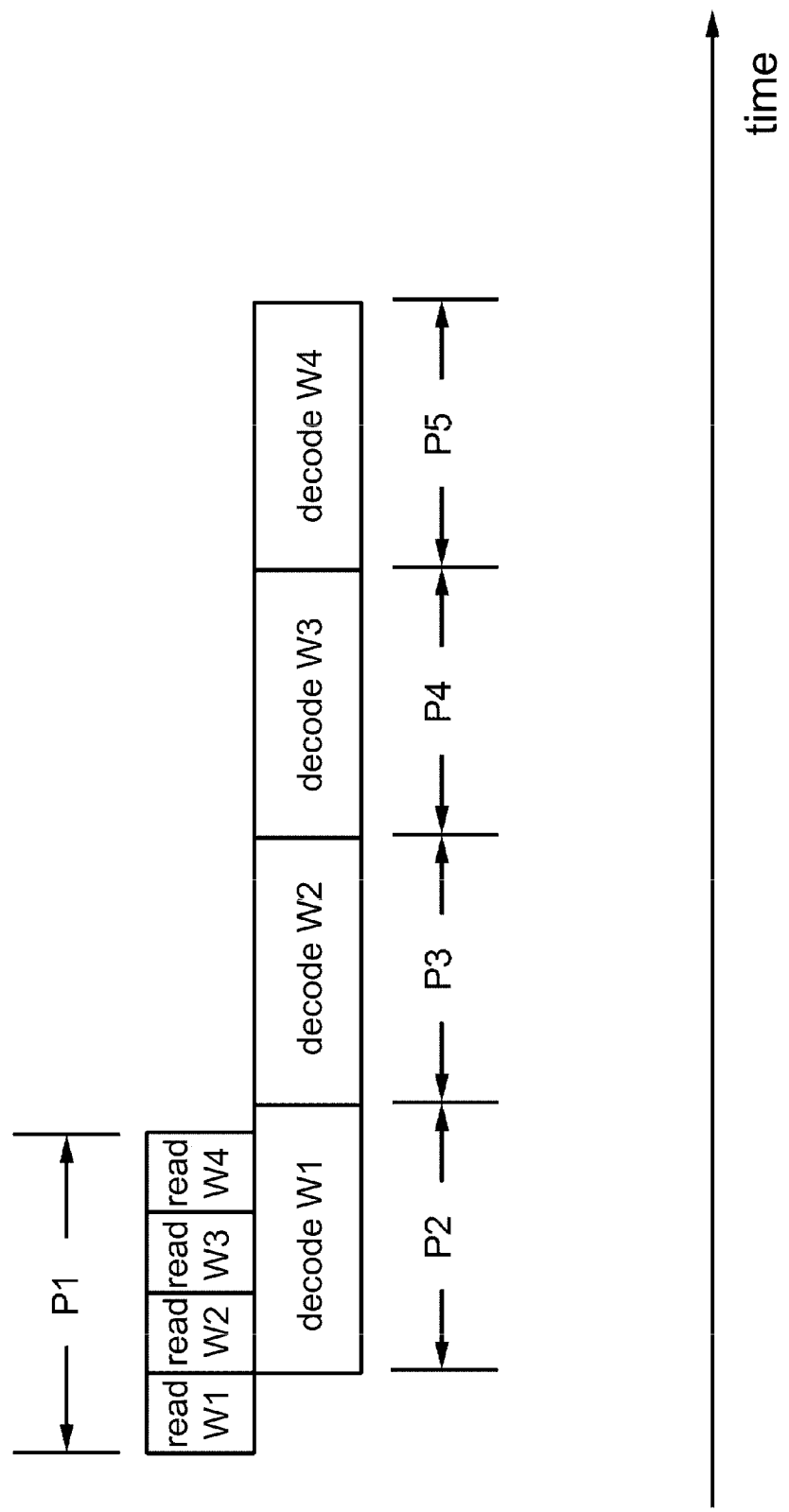
FIGS. 7~9 show several simplified timing diagrams when the memory controller in FIG. 1 performs decoding operations.
Figure 8:
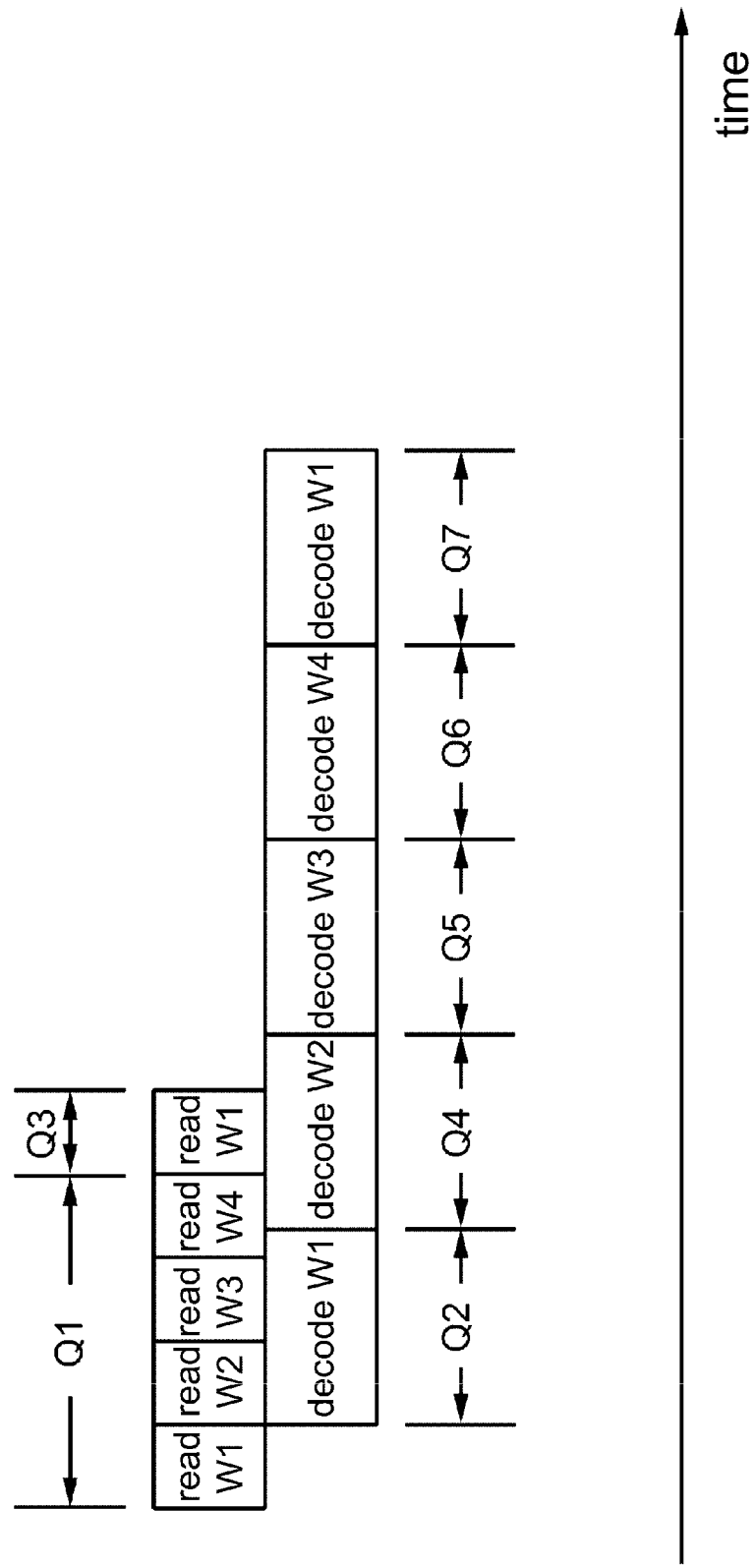
Figure 9:
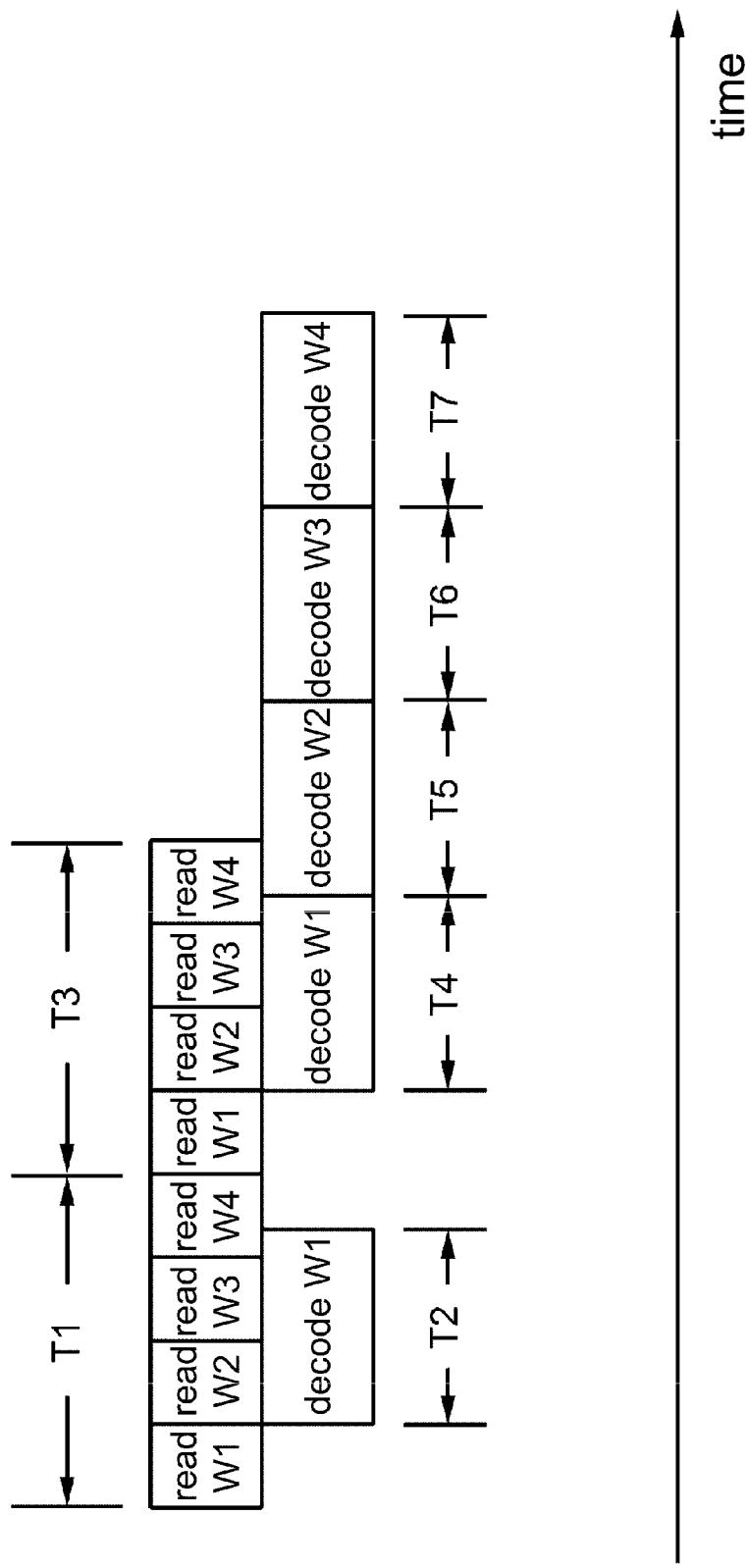

FIGS. 7~9 show several simplified timing diagrams when the memory controller 100 in FIG. 1 performs decoding operations according to the method in flowchart 600. The operations of the memory controller 100 are further explained below with reference to FIGS. 1, 3, and 7~9.

In the period P1 in FIG. 7, the memory controller 100 performs the operation 61. The LDPC decoding circuit 13 configures the memory access circuit 11 to read the hard information of four LDPC encoded code words, W1~W4, from the memory device 109. Each code word comprises a plurality of encoded bits, and the hard information of each encoded bit may comprise one or more bits.

To reduce the processing time of the memory controller 100, when the memory access circuit 11 received the first code word W1, the memory controller 100 may start the operations 62 and 63.

In the period P2, the LDPC decoding circuit 13 performs the hard decoding operations on the code word W1 and determines whether the decoding operations are successful. In the periods P3~P5, the LDPC decoding circuit 13 performs the hard decoding operations respectively on the code word W2~W4 and determines whether decoding operations are successful.

Moreover, the LDPC decoding circuit 13 may configure the output circuit 15 to output the successfully decoded output of the code words W1~W4.

In the period Q1 in FIG. 8, the memory controller 100 performs the operation 61. The LDPC decoding circuit 13 configures the memory access circuit 11 to read the hard information of four LDPC encoded code words, W1~W4, from the memory device 109. Each code word comprises a plurality of encoded bits, and the hard information of each encoded bit may comprise one or more bits.

To reduce the processing time of the memory controller 100, when the memory access circuit 11 received the first code word W1, the memory controller 100 may start the operations 62 and 63.

In the period Q2, the LDPC decoding circuit 13 performs the hard decoding operations on the code word W1 and determines whether decoding operations are successful. In the periods Q4~Q6, the LDPC decoding circuit 13 performs the hard decoding operations respectively on the code word W2~W4 and determines whether decoding operations are successful.

In this embodiment, the LDPC decoding circuit 13 may not successfully decode the code word W1 with the hard decoding operations in the period Q2, but may successfully decode the code words W2~W4 with the hard decoding operations in the periods Q4~Q6.

In the period Q3, the memory access circuit 11 performs the operation 65. The LDPC decoding circuit 13 configures the memory access circuit 11 to read the soft information of the code word W1.

In the period Q7, the LDPC decoding circuit 13 performs the operation 66 to decode the code word W1 with the soft decoding operations.

In the embodiment in FIG. 8, when the LDPC decoding circuit 13 does not successfully decode a code word, the LDPC decoding circuit 13 still continues the hard decoding operations of other code word(s). The LDPC decoding circuit 13 further configures the memory access circuit 11 to read the soft information of the unsuccessfully decoded code word(s) so as to perform the soft decoding operations.

In the period T1 in FIG. 9, the memory controller 100 performs the operation 61. Each code word comprises a plurality of encoded bits, and the hard information of each encoded bit may comprise one or more bits.

To reduce the processing time of the memory controller 100, when the memory access circuit 11 received the first code word W1, the memory controller 100 may start the operations 62 and 63.

In the period T2, the LDPC decoding circuit 13 performs the hard decoding operations on the code word W1 and determines whether decoding operations are successful.

In the period T2 in this embodiment, the LDPC decoding circuit 13 does not successfully decode the code word W1 with the hard decoding operations.

In the period T3, the memory controller 100 performs the operation 65. The LDPC decoding circuit 13 configures the memory access circuit 11 to read the soft information of the four LDPC encoded code words, W1~W4, from the memory device 109.

In the periods T4~T7, the LDPC decoding circuit 13 performs the operations 66 and 67 to perform the decoding operations according to the soft information of the code words W1~W4.

In the embodiment in FIG. 9, when the LDPC decoding circuit 13 does not successfully decode a code word, the LDPC decoding circuit 13 stops the hard decoding operations of the following code word(s). The LDPC decoding circuit 13 further configures the memory access circuit 11 to read the soft information of the unsuccessfully decoded code word and the following code word(s) so as to perform the soft decoding operations.

In the operations 63 or in the soft decoding operations, the control circuit 37 of the LDPC decoding circuit 13 may utilize the decoding indicator to predict whether the decoding operations will be successful.

For example, in the embodiment in FIG. 9, when the LDPC decoding circuit 13 performs the hard decoding operations on the code word W1, the control circuit 37 may compare one or more check values respectively with the decoding indicator (s) described above. Accordingly, the control circuit 37 may predict that the LDPC decoding circuit 13 will not successfully decode the code word W1, and the LDPC decoding circuit 13 may perform the operation 65 sooner. Therefore, the LDPC decoding circuit 13 does not need to waste the time and the energy on the hard decoding of the code word W1, and may start retrieve the soft information of the code words and perform the soft information sooner.

In the above embodiments, the memory device 109 may be realized with the NAND flash memory device and the memory access circuit 11 may read or write the data in the NAND flash memory device on a page-based style. For example, a page may comprise 8 sectors, 16 sectors, 24 sectors, etc. A sector may comprise one or more LDPC encoded code words.

When the memory access circuit 11 reads the data from the NAND flash memory device, the data in the sectors of the same page are stored in the vicinity of a physical location in the NAND flash memory device. Thus, the data in the same page are subject to the influence of the same noise or the same data rot. Therefore, in the above embodiments, when the LDPC decoding circuit 13 does not successfully decode a code word with the hard decoding operation, there is a great chance that the following code words may not be successfully decoded with the hard decoding operations. Accordingly, the LDPC decoding circuit 13 may stop the hard decoding operations on the other code word(s) of the same page and perform the soft decoding operations instead to enhance the decoding speed and to reduce the consumed energy.

In the embodiments above, the numbers of code words, pages, sectors are illustrative only, and may be suitably configured according to different design considerations. For example, the number of code words read by the memory access circuit 11 may be configured according to the type of the memory device and the application environment.

In the embodiments above, the LDPC decoding circuit 13 may also be configured to decode the code words W1~W4 after the memory access circuit 11 received all the code words W1~W4.

In the embodiments above, the LDPC decoding circuit 13 may configure the output circuit 15 to sequentially output all the code words to another device in the same period. In another embodiment, the LDPC decoding circuit 13 may also configure the output circuit 15 to output all the code words in parallel to another device in the same period. In another embodiment, the LDPC decoding circuit 13 may also configure the output circuit 15 to output one or more code words of all the code words serially or in parallel to another device in the a plurality of periods.

In the embodiments above, the memory access circuit 11 and the output circuit 15 utilize different channels for reading the encoded data from the memory device 109 and for outputting the decoded data. In another embodiment, the memory access circuit 11 and the output circuit 15 utilize the same channel for reading the encoded data from the memory device 109 and for outputting the decoded data.

In the embodiments above, the memory access circuit 11 may read a plurality of code words from one or more memory devices in one or more periods. The number of encoded bits of the code word may also be suitably configured according to different design considerations.

In the embodiments above, the hard information of the encoded bit may comprise more than one bit. The hard information and the soft information of the encoded bit may also comprise the same number of bits (depends on the definition of the hard information and the soft information).

In the embodiments above, the code words may be read or written in sequence or not in sequence in the memory device 109.

In the operation 65, the memory access circuit 11 may read all the soft information of all encoded bits of the code words in the same period. The memory access circuit 11 may also read the soft information of all encoded bits of the code words in a plurality of periods. For example, in the operation 61, the memory access circuit 11 may read the first bit of the soft information of the encoded bits of the code word W1 as the hard information of the encoded bits. In the operation 65, the memory access circuit 11 may read the second bit of the soft information of the encoded bits of the code word W1 in a first period, and read the third bit of the soft information of the encoded bits of the code word W1 in a second period.

The number, the location, and the connection of the components are illustrative only. The functional blocks in the specification and the drawings may be respectively realized with one or more circuit elements. Multiple functional blocks may also be realized with a single circuit element. For example, the memory access circuit 11 and the output circuit 15 may be integrated into a single IC package. The memory controller 100, the memory access circuit 11, the LDPC decoding circuit 13, the output circuit 15, and the operations in the flowchart 600 may be respectively realized with software, firmware, hardware, or the combination thereof. For example, the LDPC decoding circuit 13 may be realized with a specifically designed circuit and/or a processor executing LDPC decoding algorithms.

In the embodiments above, the LDPC decoding circuit 13 of the memory controller 100 decodes the encoded data according to the hard information of the code words first. The computation complexity is therefore reduced and most of the errors may be corrected with the hard decoding operations. When the LDPC decoding circuit 13 does not successfully decode the code word with the hard decoding operations, the LDPC decoding circuit 13 may decode the encoded data according to the soft information of the code word. Therefore, although there may be a few serious errors, the LDPC decoding circuit 13 may still correct the serious errors with the soft decoding operations. The memory controller 100 may possess a low computation complexity and still maintain the decoding performance.

Moreover, in some type of memory devices, the data stored in the vicinity of a physical location are subject to the influence of the same noise or the same data rot. The memory controller 100 may compare the check value with the decoding indicator when performing the hard decoding operations to predict whether the LDPC decoding circuit will successfully decode. When the LDPC decoding circuit 13 does not successfully decode a code word with the hard decoding operation, the following code words stored in the vicinity of the physical location may not be decoded successfully with the hard decoding operations. The memory controller 100 may stop the hard decoding of the following code words to reduce the computation time and the consumed energy. The memory access circuit 11 may read the soft information of the code words and the LDPC decoding circuit 13 may perform the soft decoding operations sooner. The memory controller 100 may further reduce the decoding time and the consumed energy, and still maintain the decoding performance.

The same reference numbers may be used throughout the drawings to refer to the same or like parts, components, or operations. Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an openended fashion, and thus should be interpreted to mean "include, but not limited to . . . ." Also, the phrase "coupled with" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a", "an", and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A memory controller, comprising:
   a memory access circuit for reading a hard information of a first code word and a hard information of a second code word; and
   a low density parity check (LDPC) decoding circuit for decoding the first code word according to the hard information of the first code word, and for comparing a check value generated according to the hard information of the first code word with a decoding indicator;
   wherein the LDPC decoding circuit determines whether decoding the first code word according the hard information of the first code word is successful according to the check value and the decoding indicator; and when decoding the first code word according the hard information of the first code word is not successful, the LDPC decoding circuit configures the memory access circuit to read a soft information of the first code word and decodes the first code word according to the soft information of the first code word.

2. The memory controller of claim 1, wherein the LDPC decoding circuit configures the memory access circuit to read a soft information of the second code word and decode the second code word according to the soft information of the second code word.

3. The memory controller of claim 2, wherein the LDPC decoding circuit generates the check value according to a plurality of check node messages generated according to the hard information of the first code word.

4. The memory controller of claim 3, wherein the LDPC decoding circuit generates the check value according to the check node messages and a parity check matrix.

5. The memory controller of claim 3, wherein when the check value is greater than the decoding indicator, the LDPC decoding circuit configures the memory access circuit to read the soft information of the first code word and decodes the first code word according to the soft information of the first code word.

6. The memory controller of claim 3, wherein the check node messages of the first code word comprises at least one of a probability, a likelihood, and a posteriori probability.

7. The memory controller of claim 2, wherein the LDPC decoding circuit generates the check value according to a plurality of variable node messages generated according to the hard information of the first code word.

8. The memory controller of claim 7, wherein the LDPC decoding circuit generates the check value according to at least one of a sum of at least part of the variable node messages, a sum of a first numbers of the greatest variable node messages, a sum of a second numbers of the smallest variable node messages, and a sum of order set values generated according to the variable node messages.

9. The memory controller of claim 7, wherein when the check value is greater than the decoding indicator, the LDPC decoding circuit configures the memory access circuit to read the soft information of the first code word and decodes the first code word according to the soft information of the first code word.

10. The memory controller of claim 7, wherein the variable node messages of the first code word comprises at least one of a probability, a likelihood, and a posteriori probability.

11. A memory controller, comprising:
    a memory access circuit for reading a first code word and a second code word from one or more memory devices, wherein the first code word and the second code word respectively comprises a plurality of coded bits; and
    a low density parity check (LDPC) decoding circuit for decoding the first code word according to the hard information of the coded bits of the first code word;
    wherein when the LDPC decoding circuit does not decode the first code word successfully according to the hard information of the coded bits of the first code word, the LDPC decoding circuit configures the memory access circuit to read the soft information of the coded bits of the first code word and the soft information of the coded bits of the second code word, and decodes the first code word and the second code word according to the soft information of the coded bits of the first code word and the soft information of the coded bits of the second code word.

12. The memory controller of claim 11, wherein the LDPC decoding circuit generate a plurality of check node messages and a plurality of variable node messages according to the hard information of the first code word to determine whether the LDPC decoding circuit decodes the first code word successfully.

13. The memory controller of claim 12, wherein the LDPC decoding circuit determines the first code word is not decoded successfully when a sum of the variable node messages is greater than a first predetermined value, when the sum of the variable node messages is less than a second predetermined value, or a difference between the sum of the variable node message and a previous sum of the variable node messages is less than a third predetermined value.

14. The memory controller of claim 13, wherein the LDPC decoding circuit generates a check value according to the check node messages and a parity check matrix; and the LDPC decoding circuit determines the first code word is not decoded successfully when the check value is greater than a fourth predetermined value.

15. The memory controller of claim 11, wherein a first period in which the memory access circuit reads the second code word overlaps at least part of a second period in which the LDPC decodes the first code word.

16. The memory controller of claim 11, wherein the LDPC decoding circuit decodes the second code word according to the hard information of the coded bits of the second code word.

17. A memory control method, comprising:
reading a hard information of a first code word and a hard information of a second code word by utilizing a memory access circuit;
decoding the first code word according to the hard information of the first code word by utilizing a low density parity check (LDPC) decoding circuit;
generating a check value by utilizing the LDPC decoding circuit according to the hard information of the first code word;
comparing the check value with a decoding indicator by utilizing the LDPC decodine circuit;
verifying whether decoding the first code word according the hard information of the first code word is successful by utilizing the LDPC decoding circuit according to the check value and the decoding indicator; and
reading a soft information of the first code word by utilizing the memory access circuit and decoding the first code word by utilizing the LDPC decoding circuit according to the soft information of the first code word when decoding the first code word according the hard information of the first code word is not successful.

18. A memory control method, comprising:
reading a first code word and a second code word from one or more memory devices by utilizing a memory access circuit, wherein the first code word and the second code word respectively comprises a plurality of coded bits;
performing a low density parity check (LDPC) decoding by utilizing a low density LDPC decoding circuit according to the hard information of the coded bits of the first code word;
when the first code word is not decoded successfully, reading the soft information of the coded bits of the first code word and the soft information of the coded bits of the second code word by utilizing the memory access circuit, and decoding the first code word and the second code word by utilizing the LDPC decoding, circuit according to the soft information of the coded bits of the first code word and the soft information of the coded bits of the second code word.

19. The memory control method of claim 18, further comprising:
generating a plurality of check node messages and a plurality of variable node messages by utilizing the LDPC decoding circuit according to the hard information of the coded bits of the first code word;
wherein the first code word is not decoded successfully when a sum of the variable node messages is greater than a first predetermined value, when the sum of the variable node messages is less than a second predetermined value, a difference between the sum of the variable node message and a previous sum of the variable node messages is less than a third predetermined value, or a check value generated according to the check node messages and a parity check matrix is greater than a fourth predetermined value.

20. The memory control method of claim 18, further comprising:
decoding the second code word by utilizing the LDPC decoding circuit according to the hard information of the coded bits of the second code word.

* * * * *